(12) United States Patent
Kasuga

(10) Patent No.: US 6,704,201 B2
(45) Date of Patent: Mar. 9, 2004

(54) POWER FEED AND HEAT DISSIPATING DEVICE FOR POWER SEMICONDUCTOR DEVICES

(75) Inventor: Nobuyuki Kasuga, Kanagawa (JP)

(73) Assignee: Tokyo R & D Co., Ltd., Tokyo (JP)

( * ) Notice: Subject to any disclaimer, the term of this patent is extended or adjusted under 35 U.S.C. 154(b) by 80 days.

(21) Appl. No.: 09/959,514

(22) PCT Filed: Jun. 1, 2000

(86) PCT No.: PCT/JP00/03567

§ 371 (c)(1),
(2), (4) Date: Oct. 29, 2001

(87) PCT Pub. No.: WO00/75991

PCT Pub. Date: Dec. 14, 2000

(65) Prior Publication Data

US 2003/0047304 A1 Mar. 13, 2003

(30) Foreign Application Priority Data

Jun. 3, 1999 (JP) ............................... 11-157078

(51) Int. Cl.⁷ .................................................. H05K 7/20
(52) U.S. Cl. ....................... 361/704; 165/80.2; 165/185; 257/707; 257/712; 361/707; 361/719; 361/710; 361/715; 363/144
(58) Field of Search ................................ 165/80.2, 185; 174/16.3; 257/706–707, 712–713, 666, 672, 787, 678, 693; 361/690, 704–710, 715, 717–722; 310/64, 71; 363/141, 144

(56) References Cited

U.S. PATENT DOCUMENTS

| | | | | | |
|---|---|---|---|---|---|
| 4,720,771 A | * | 1/1988 | Horton | ........................ | 361/707 |
| 5,191,512 A | * | 3/1993 | Ogura et al. | ................. | 361/707 |
| 5,875,097 A | * | 2/1999 | Amaro et al. | ............... | 361/704 |
| 6,307,272 B1 | * | 10/2001 | Takahashi et al. | ........... | 257/787 |
| 6,348,727 B1 | * | 2/2002 | Westmarland et al. | ....... | 257/675 |

* cited by examiner

Primary Examiner—Gregory Thompson
(74) Attorney, Agent, or Firm—Kanesaka & Takeuchi

(57) ABSTRACT

In an electric circuit using a plurality of power semiconductor devices 1, the power semiconductor devices have heat radiation metallic parts 5 to which the electrodes in the power semiconductor devices are electrically connected within a package of the semiconductors. Among the plurality of power semiconductor devices, the heat radiation metallic parts of those having electrodes of the same potential connected to the heat radiation metallic parts are conductively fixed to a single radiator 6 having conductivity. Thus, the radiators are used as a single connection terminal. Besides, the plurality of radiators are conductively fixed to a single heat radiating plate 7 having conductivity, and the heat radiating plate is used as a single connection terminal, or the radiator is electrically insulated and fixed to another radiator 11.

5 Claims, 13 Drawing Sheets

F I G. 3 (1)
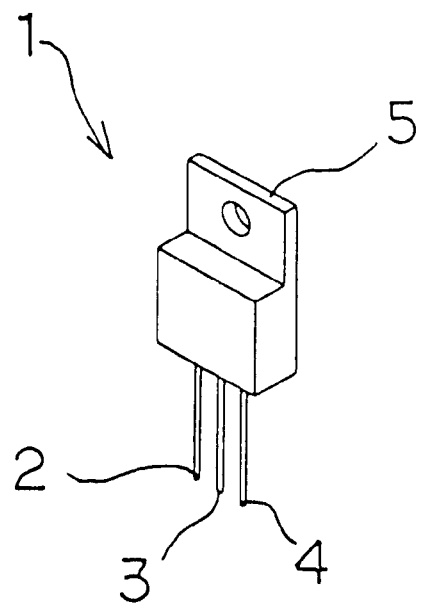
F I G. 3 (2)
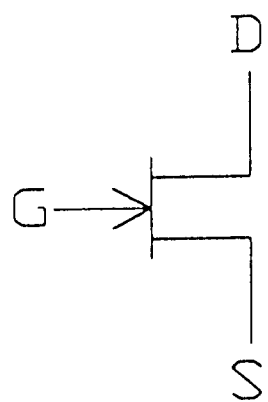

POWER FEED AND HEAT DISSIPATING DEVICE FOR POWER SEMICONDUCTOR DEVICES

TECHNICAL FIELD

The present invention relates to an electric supply and heat radiating apparatus for a power semiconductor device in an electric circuit having a plurality of power semiconductor devices, wherein the power semiconductor devices are made to have a simplified electric supply structure and a heat radiation action.

BACKGROUND ART

Generally, a control device to which a relatively large power is supplied has an electric circuit provided with a plurality of power semiconductor devices. For example, for the electric vehicle receiving attention these days, an electric motor as a vehicle drive source and its motor drive circuit, namely a device having a plurality of power semiconductor devices, are housed in a metallic casing to protect the motor and the circuit and mounted on the vehicle. This casing comprises a metallic cylindrical case and cover made of aluminum or the like and is assembled by housing the motor section in the case, placing the cover in position and joining the case and the cover with bolts.

The motor drive circuit mainly comprises power semiconductor devices as the switching device for controlling switching the electric supply to the motor coil at a high speed. And, when the power semiconductor devices generate heat up to a rated temperature, it is necessary to suppress or stop the output of the motor in order to protect the circuit. Then, in order to avoid occurrence of such a situation and to obtain a high power, it is inevitable to externally release the heat of the power semiconductor devices to out of the motor case.

Therefore, conventionally, the heat radiation metallic parts provided on the power semiconductor devices are mounted on a heat sink having a heat radiating action.

In such a conventional electric circuit, e.g., FET, the drain electrode and the heat radiation metallic part of the power semiconductor device are electrically connected. And when a power semiconductor device used on a different circuit section is mounted on the same heat sink, it is necessary to electrically insulate the respective power semiconductor devices from the heat sink.

And, when the electrical insulation is secured as described above, the heat radiation property of the power semiconductor device is degraded because when the electrical insulator has a high electric resistance, it also has a high heat resistance.

When the power semiconductor device is soldered to a circuit board to provide a circuit structure, the circuit is generally connected to terminals on the circuit board for connecting to an external circuit such as a power supply and a motor. But, the power semiconductor device generally deals with a large current and requires, for example, a structure or a process for forming a pattern with copper foils having a large thickness on the circuit board, to form the circuit board in a multilayered structure to use its inner layer or to form a grommet terminal on the circuit board. Therefore, the conventional circuit board has a complex structure which is hard to be made small, and needs many parts and processes, resulting in a high cost.

In view of the aforesaid problems, it is an object of the invention to provide an electric supply and heat radiating apparatus for a power semiconductor device which is mounted on a circuit board, has a simplified electric supply structure for the power semiconductor device and also a heat radiation action.

DISCLOSURE OF THE INVENTION

According to an aspect of the invention, an electric supply and heat radiating apparatus for a power semiconductor device in an electric circuit using a plurality of power semiconductor devices is characterized in that:

the power semiconductor devices are provided with heat radiation metallic parts to which electrodes of the devices are electrically connected within packages of the semiconductors;

among the plurality of power semiconductor devices, the heat radiation metallic parts of those having the electrodes of the same potential connected to the heat radiation metallic parts are electrically connected and secured to a single radiator having conductivity; and the radiator is used as one connection terminal.

As described above, according to the apparatus of the invention, the plurality of heat radiation metallic parts are electrically connected to the single radiator, which is used as the single connection terminal. Accordingly, the necessity of separate wiring from the electrodes related to the plurality of heat radiation metallic parts can be eliminated, and the electric supply structure can be simplified.

Besides, the plurality of heat radiation metallic parts are connected to the radiator without through an electric insulator, so that a heat resistance between the individual power semiconductor devices and the radiator can be made small, and the heat radiation of the power semiconductor devices can be enhanced.

The radiator is provided in a plurality of numbers and electrically connected and fixed to a single conductive heat radiating plate, and the heat radiating plate is used as one connection terminal.

Thus, the plurality of radiators are electrically connected to the heat radiating plate so to be used as a single connection terminal, so that the aforesaid electric supply structure can be made more simple. Since the plurality of radiators are additionally connected to the heat radiating plate, the heat radiation property of the power semiconductor devices can be enhanced further more.

The heat radiating plate is electrically insulated and fixed to another radiator.

In the aforesaid structure, heat of the heat radiating plate is released by another radiator, so that the heat radiation property of the power semiconductor devices can be improved further more.

The radiator is electrically insulated and fixed to another radiator.

In the aforesaid structure, heat of the radiator is released by another radiator, so that the heat radiation property of the power semiconductor devices can be improved further more.

Fixing areas between the radiator and another radiator are larger than the fixing areas between the radiator and the heat radiation metallic parts.

The aforesaid structure further improves the heat radiation property of the power semiconductor devices.

Specifically, when the radiator and another radiator are electrically insulated, a heat resistance between them is increased, but the present invention has determined the fixing areas between the radiator and another radiator to be larger than those between the radiator and the heat radiation metallic parts. Therefore, an mount of heat conducted from the heat radiation metallic parts to the radiator and an amount of heat conducted from the radiator to another radiator can be secured in good balance. As a result, heat of the power semiconductor devices can be radiated efficiently.

The radiator is a plate member and secured to another radiator by screws.

By configuring as described above, the radiator can be provided efficiently.

Especially, the radiator of the present invention is a plate member and can be produced by stamping, and its production cost can be reduced.

BRIEF DESCRIPTION OF THE DRAWINGS

FIG. 3 (1) shows an external perspective view of the power semiconductor device and FIG. 3 (2) shows its circuit symbols according to the embodiment of the invention.

BEST MODE FOR CARRYING OUT THE INVENTION

Embodiments of the invention will be described with reference to the accompanying drawings.

An embodiment refers to FET as an example of a power semiconductor device, which has its electric supply and heat radiating apparatus incorporated into an electric motor. First, for convenience, the electric motor will be described.

Figure 1:
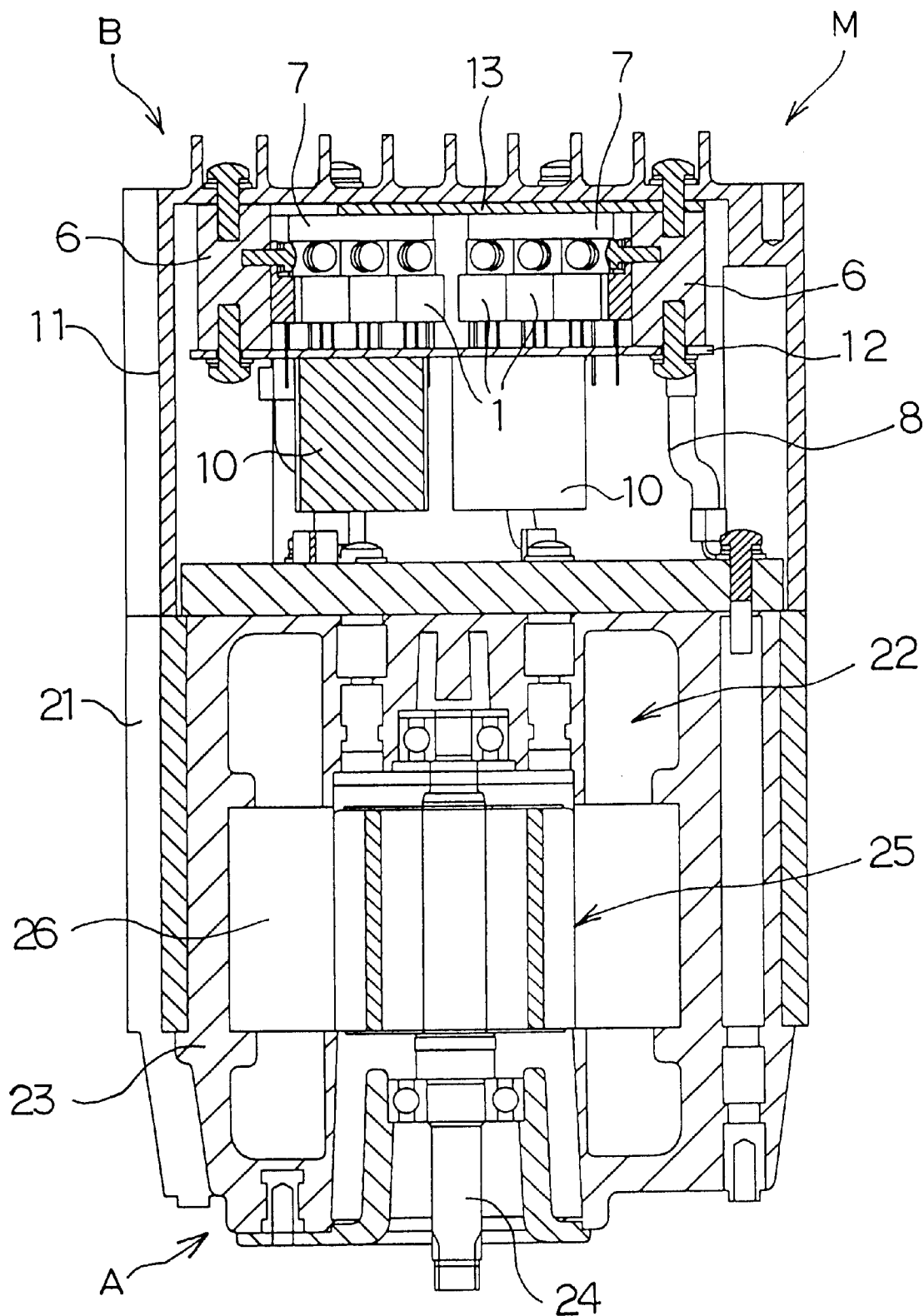
FIG. 1 is a vertical sectional view showing an electric motor provided with an electric supply and heat radiating apparatus for power semiconductor devices according to an embodiment of the invention.

As shown in FIG. 1, an electric motor M comprises basically a motor module A which accommodates mechanical elements of the motor, and a circuit module B which accommodates electrical control elements. In this embodiment, the motor is used as a drive source for an electric vehicle.

The motor module A comprises a substantially cylindrical hanger case 21 housing therein a motor body 22 and a resin block 23 with the motor body resin-sealed therein. The motor body 22 comprises a motor axis 24 rotatably supported with respect to the hanger case 21, a rotor 25 fixed to the motor axis 24 and a stator 26 fixed to the hanger case 21.

The circuit module B comprises a metallic heat sink case 11 housing therein a circuit board 12 for controlling electric conduction of the motor body 22, power semiconductor devices 1 mounted on the circuit board 12, sub-heat sinks 6 serving as a radiator to be described afterward, a trident heat radiating plate 7, a condenser and other related component parts. Unillustrated CPU and its related component parts for switching control of the power semiconductor devices are also disposed within the heat sink case 11.

The motor body 22 has its coil formed into three phases (U, V and W phases) by arranging a winding at predetermined positions of a core, and the coils of the respective phases are electrically connected to the circuit board 12 on which a motor drive circuit is mounted.

Figure 2:
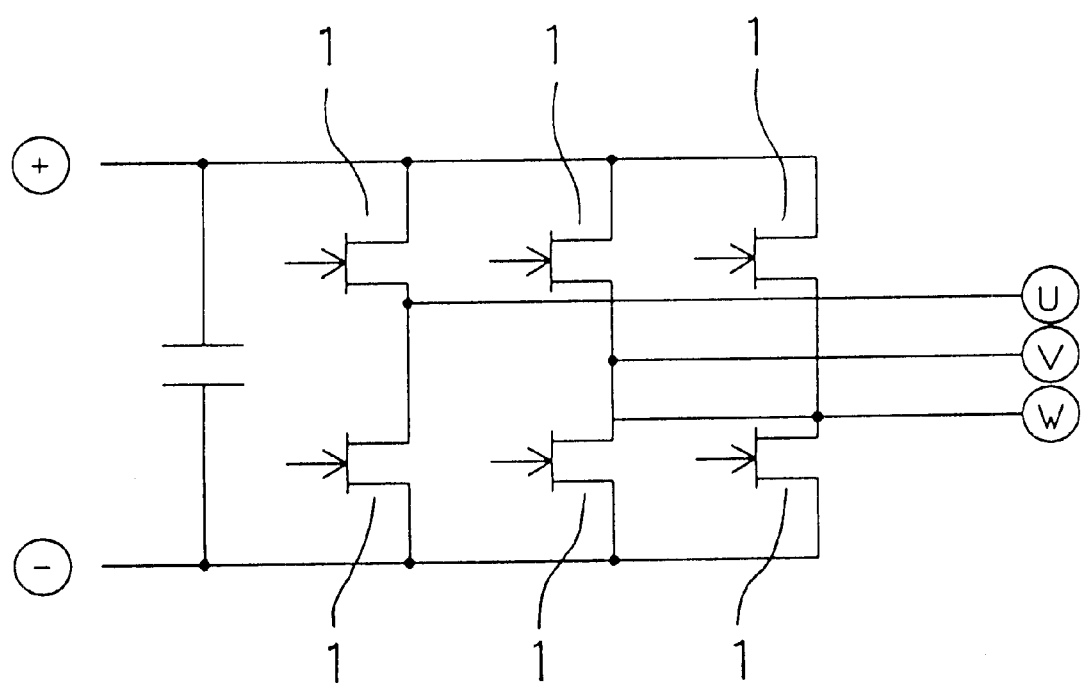
FIG. 2 is a diagram showing an inverter circuit using the power semiconductor device according to the embodiment of the invention.

FIG. 2 shows an inverter circuit using the power semiconductor devices 1. The plus pole and the minus pole of the connection terminals are connected to a power supply, and connection terminals U, V and W are connected to the motor.

The power semiconductor device 1 shown in FIG. 3 has a gate, electrode 2, a drain electrode 3 and a source electrode 4, and a heat radiation metallic part 5 electrically connected to the drain electrode 3.

Three power semiconductor devices 1 shown at the upper section of FIG. 2 can be attached directly to a single radiator because the respective drain electrodes 3 have the same electric potential in terms of the circuit.

Figure 4:
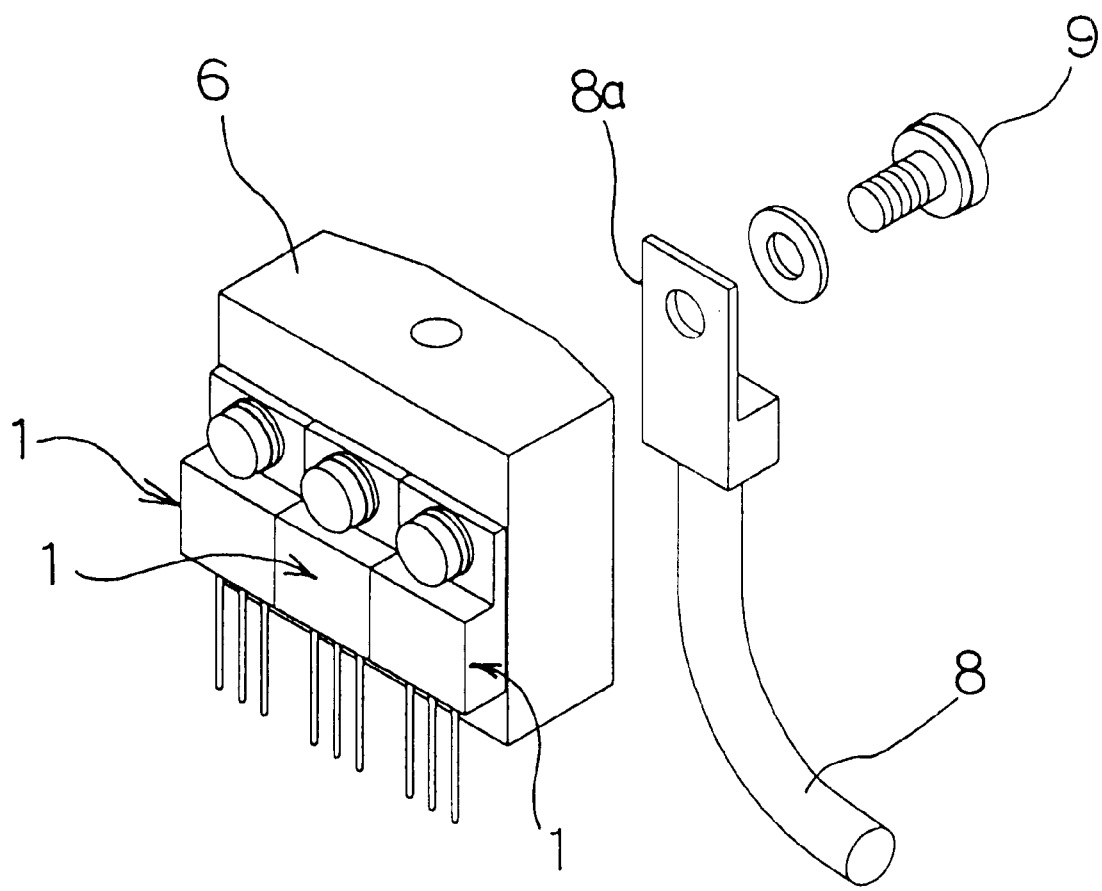
FIG. 4 is an external perspective diagram showing a plurality of power semiconductor devices mounted on a sub-heat sink according to the embodiment of the invention.

With this embodiment, the three power semiconductor devices 1 are screwed to one single block sub-heat sink 6 as shown in FIG. 4. The sub-heat sink 6 is a conductive metallic member. By directly fixing the three power semiconductor devices 1 to the sub-heat sink 6, the power semiconductor devices 1 are electrically connected with the sub-heat sink 6.

Besides, the sub-heat sink 6 is used as a single connection terminal. In this embodiment, a screw-in section is formed on the back of the sub-heat sink 6, and a terminal 8a of a lead 8 is connected to the screw-in section by a screw 9.

Thus, the device of this embodiment has the heat radiation metallic parts 5 of the plurality of power semiconductor devices 1 electrically connected to the single sub-heat sink 6 and uses this single sub-heat sink 6 as a single connection terminal. Thus, the need for separate wiring from the drain electrode related to the plurality of heat radiation metallic parts can be eliminated, and an electric supply structure can be simplified.

This embodiment also has the plurality of heat radiation metallic parts 5 connected to the sub-heat sink 6 without through an electrical insulator, so that a heat resistance between each power semiconductor device 1 and the sub-heat sink 6 can be lowered. Accordingly, the heat radiation of the power semiconductor device 1 can be enhanced.

Figure 5:
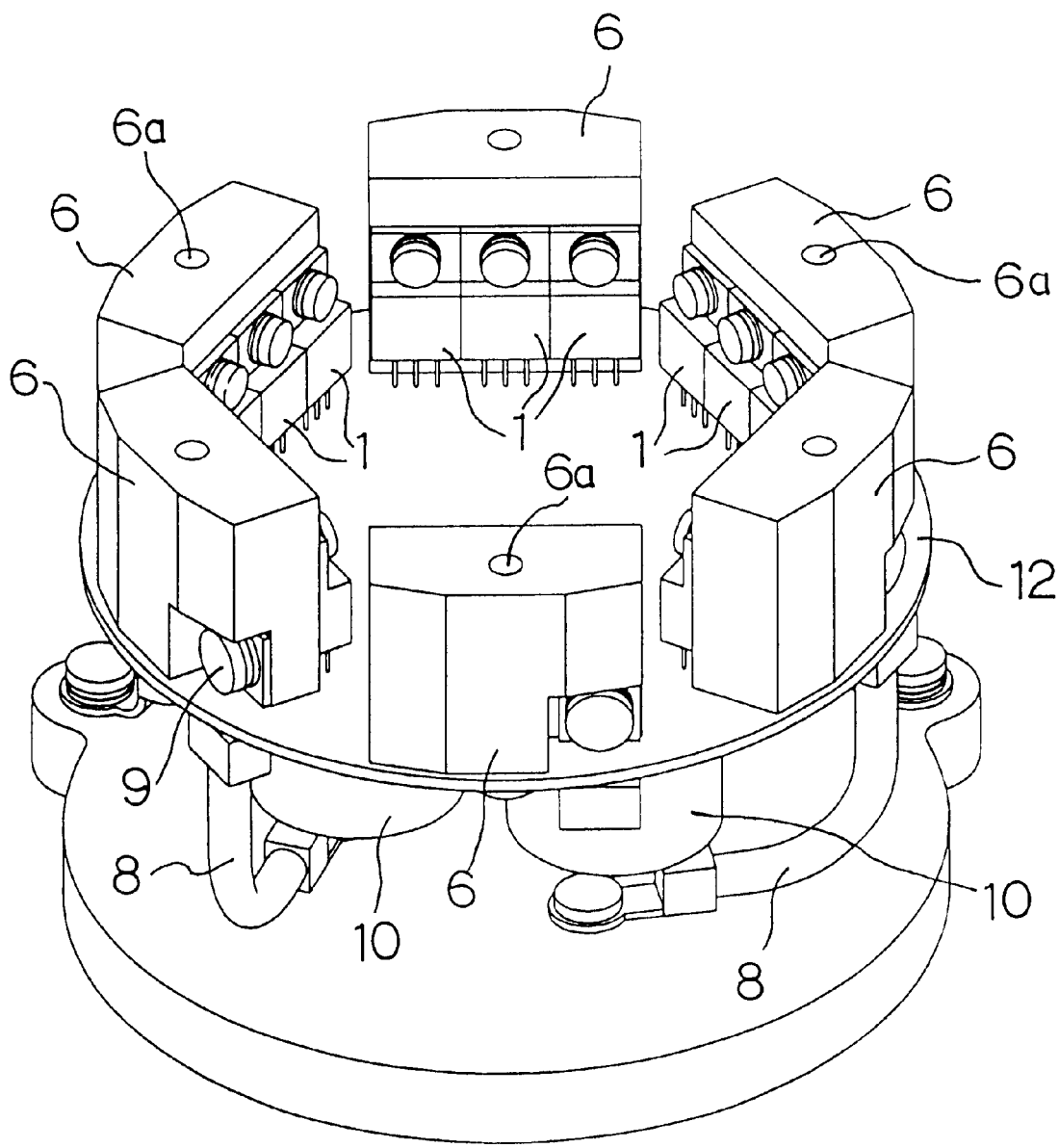
FIG. 5 is an external perspective diagram showing a state that a plurality of sub-heat sinks with a plurality of power semiconductor devices mounted thereto are disposed on a circuit board.

As shown in FIG. 5, the circuit board 12 is a circular plate having a predetermined diameter. On the upper surface of the circuit body 12, the sub-heat sinks 6 with the power semiconductor devices 1 tightly fixed thereto are mounted and the condensers 10 having a large capacity mounted on the back surface.

Figure 6:
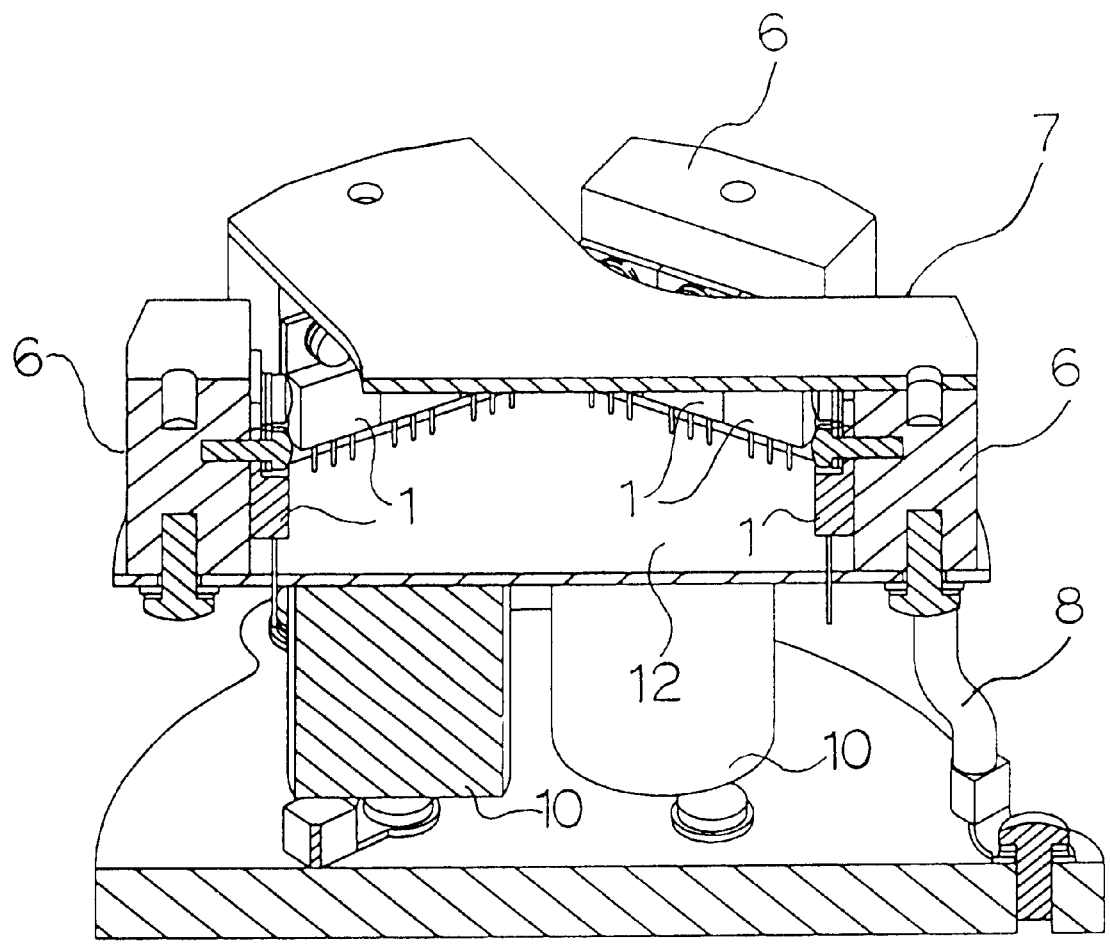
FIG. 6 is an external perspective view partly broken in section showing a state that the plurality of sub-heat sinks are disposed on the circuit board, the sub-heat sinks being provided with a heat radiating plate.
Figure 7:
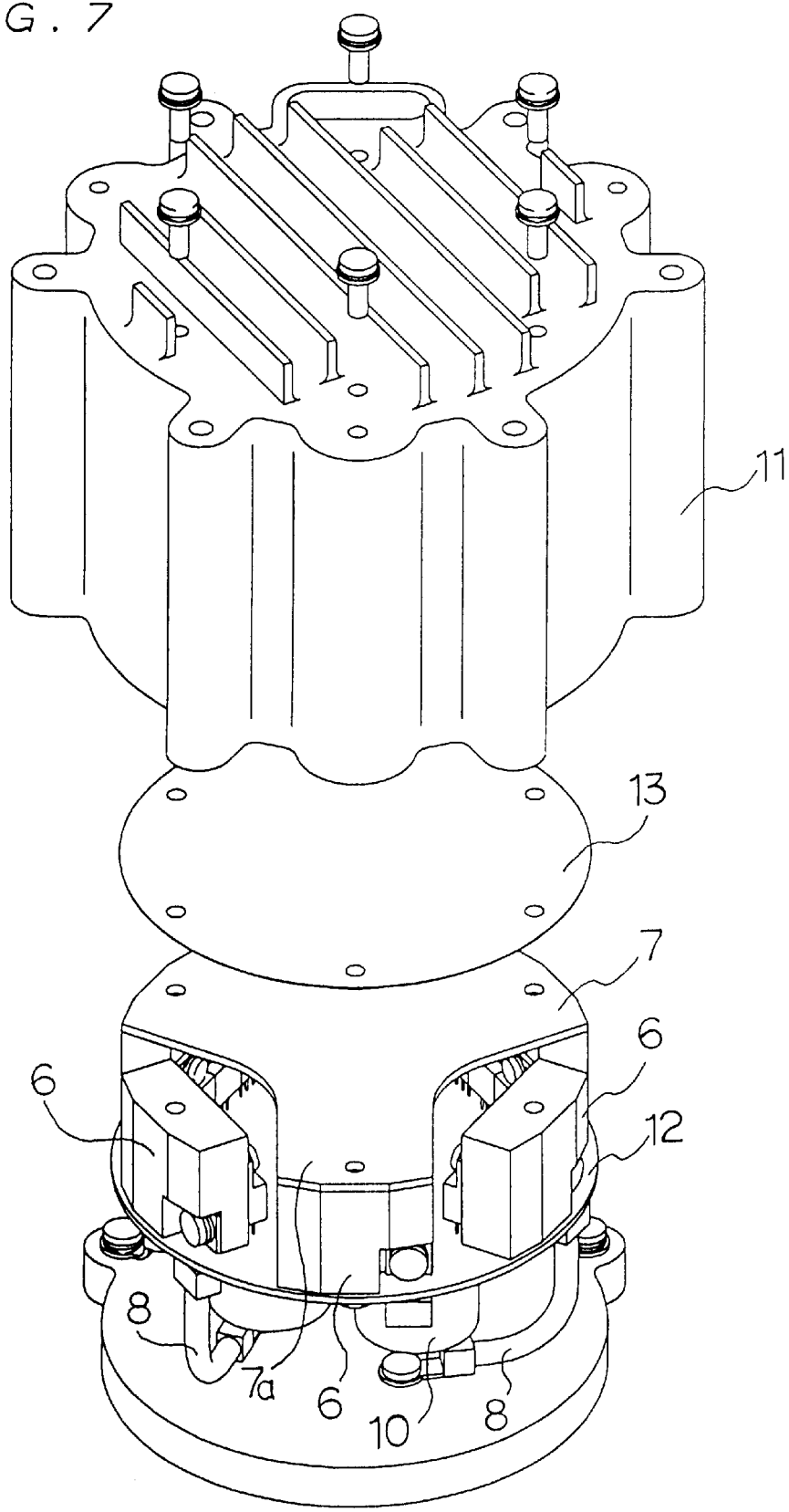
FIG. 7 is an external perspective view showing a circuit module portion according to the embodiment of the invention.

Further, as shown in FIG. 6 and FIG. 7, the plurality of sub-heat sinks 6 are fixed to projections 7a of the trident heat radiating plate 7 which is another radiator. The sub-heat sinks 6 electrically connected and fixed to the heat radiating plate 7 have the same electrical potential in terms of the circuit.

The sub-heat sinks 6, each having a screw hole 6a on its top surface, and the heat radiating plate 7 is fixed to the sub-heat sinks 6 by unillusstrated screws through the screw holes 6a.

Thus, the plurality of sub-heat sinks 6 are electrically connected to the heat radiating plate 7 and they are collectively used as a single connection terminal. Therefore, a plurality of electric supply structures can be integrated into one body, which is made simple further more. Since the plurality of heat radiators (sub-heat sinks 6) are further connected to the heat radiating plate 7, a heat radiation property of the power semiconductor devices can be enhanced further more.

The heat radiating plate 7 is forced to be in pressure contact with the heat sink case 11 with an insulation sheet 13 interposed between them as shown in FIG. 1 and FIG. 7. The insulation sheet 13 is disposed also on the top of the sub-heat sink 6, on which the heat radiating plate 7 is not mounted, and forced to be in pressure contact with the heat sink case 11. Radiator fins are formed on the outer surface of the heat sink case 11.

As described above, the heat radiating plate 7 is forced to be in pressure contact with the heat sink case 11, so that heat is externally radiated from the heat radiating plate 7 through the heat sink case 11. As a result, the heat radiation property of the power semiconductor device 1 can be enhanced further more. The sub-heat sinks 6 to which the heat radiating plate 7 is not mounted are also forced to be in pressure contact with the heat sink case 11, so that heat of the sub-heat sinks 6 is externally radiated through the heat sink case 11, and the heat radiation property of the power semiconductor device 1 is improved.

The heat radiating plate 7 and the sub-heat sinks 6 are electrically insulated and fixed to the heat sink case 11, so that a large current of the power semiconductor device 1 is not externally scattered to be lost from the heat sink case 11. Thus, safety can be secured.

Figure 8:
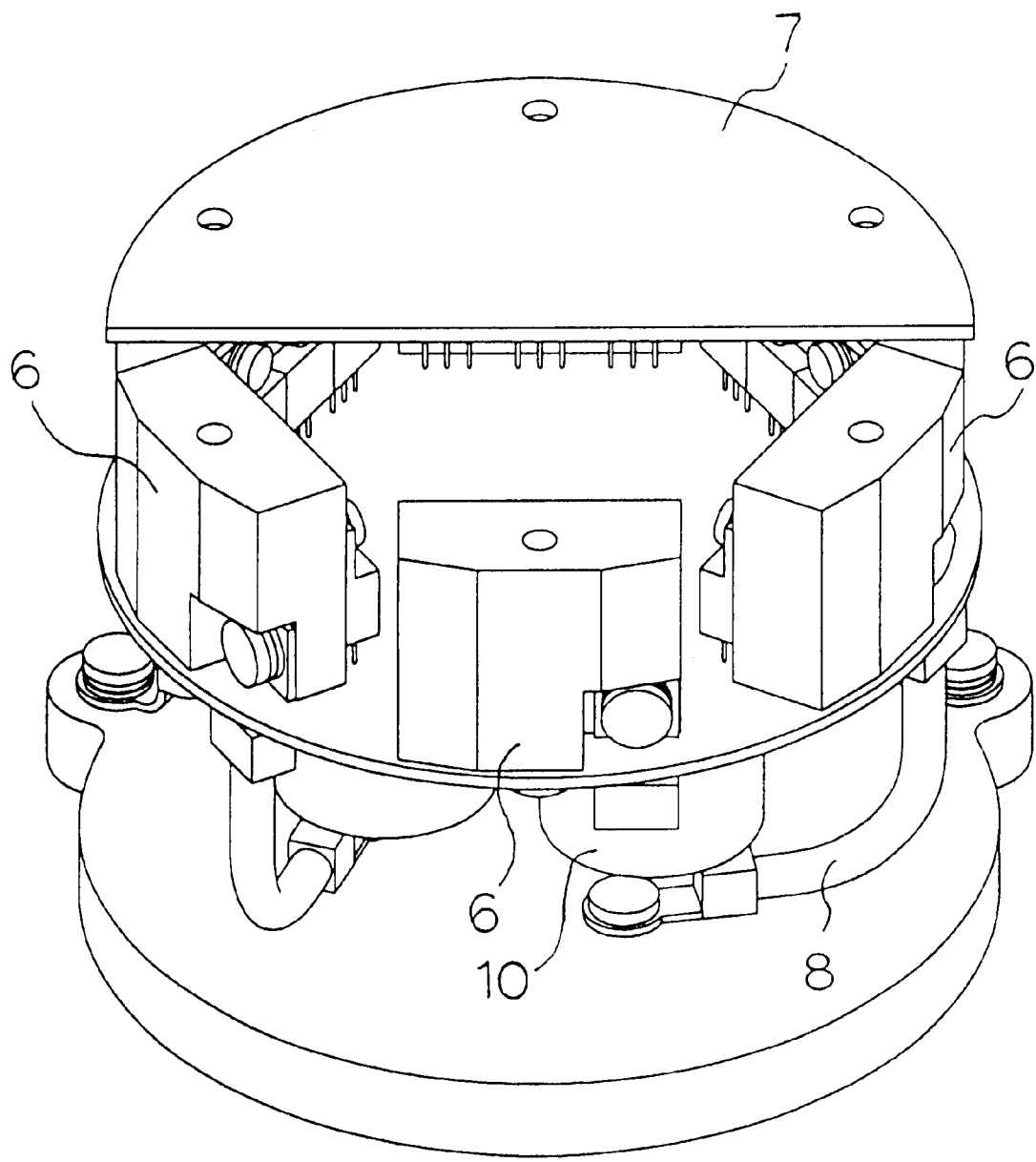
FIG. 8 is an external perspective view showing a state that the plurality of sub-heat sink are mounted on the circuit board, the sub-heat sinks being provided with a heat radiating plate.
Figure 9:
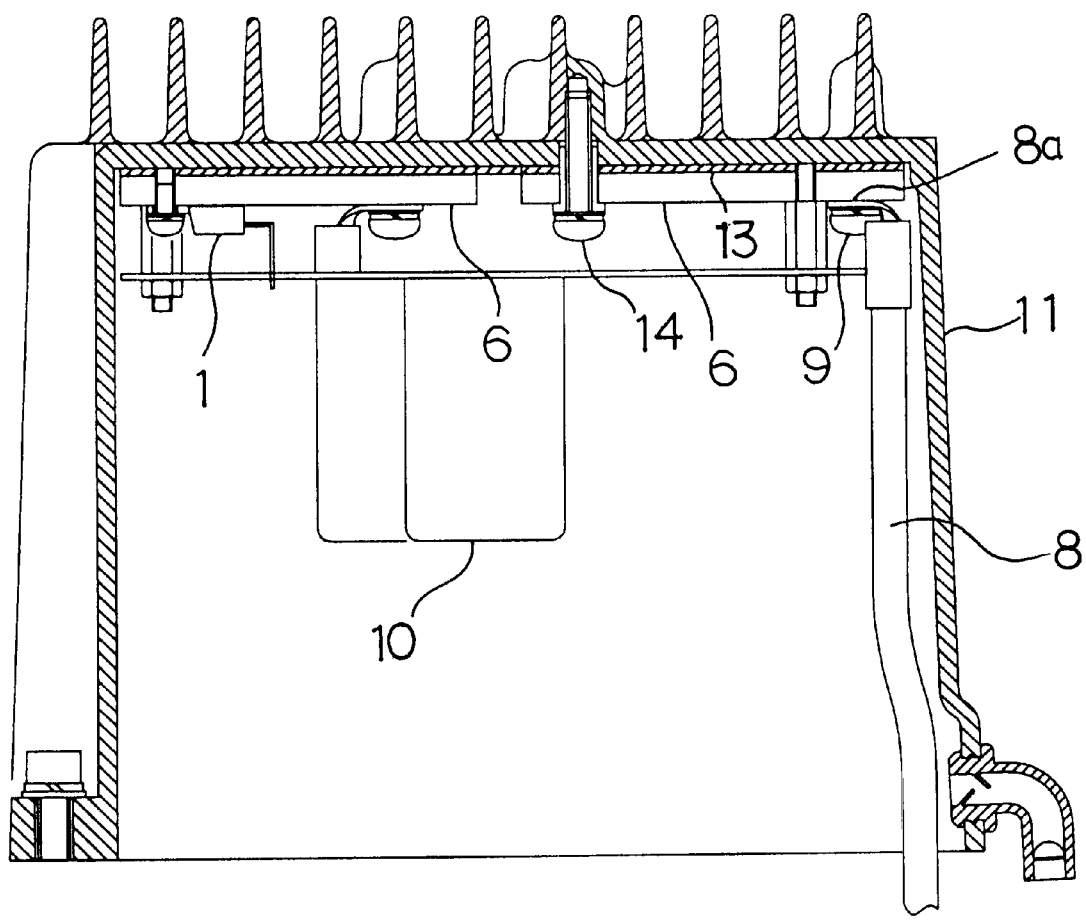
FIG. 9 is a vertical sectional view showing an electric supply and heat radiating apparatus for the power semiconductor device according to an embodiment of the invention.
Figure 10:
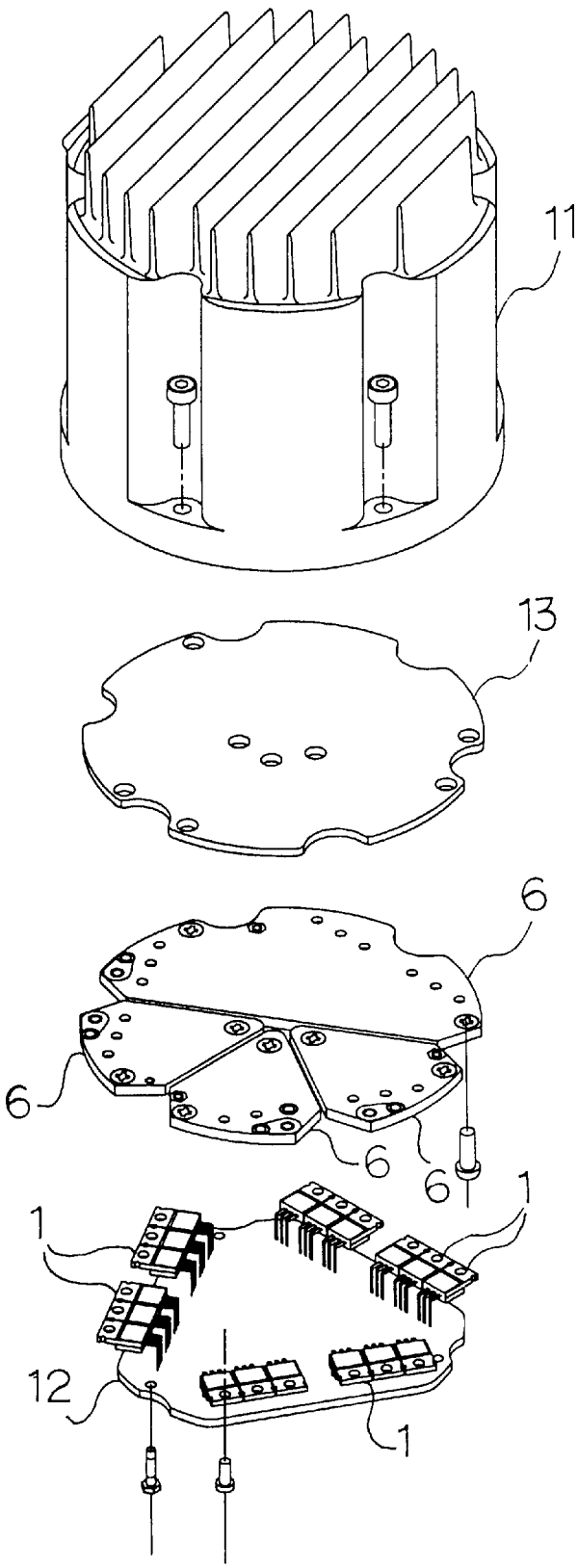
FIG. 10 is an exploded perspective view showing the electric supply and heat radiating apparatus for the power semiconductor device according to the embodiment of the invention.
Figure 11:
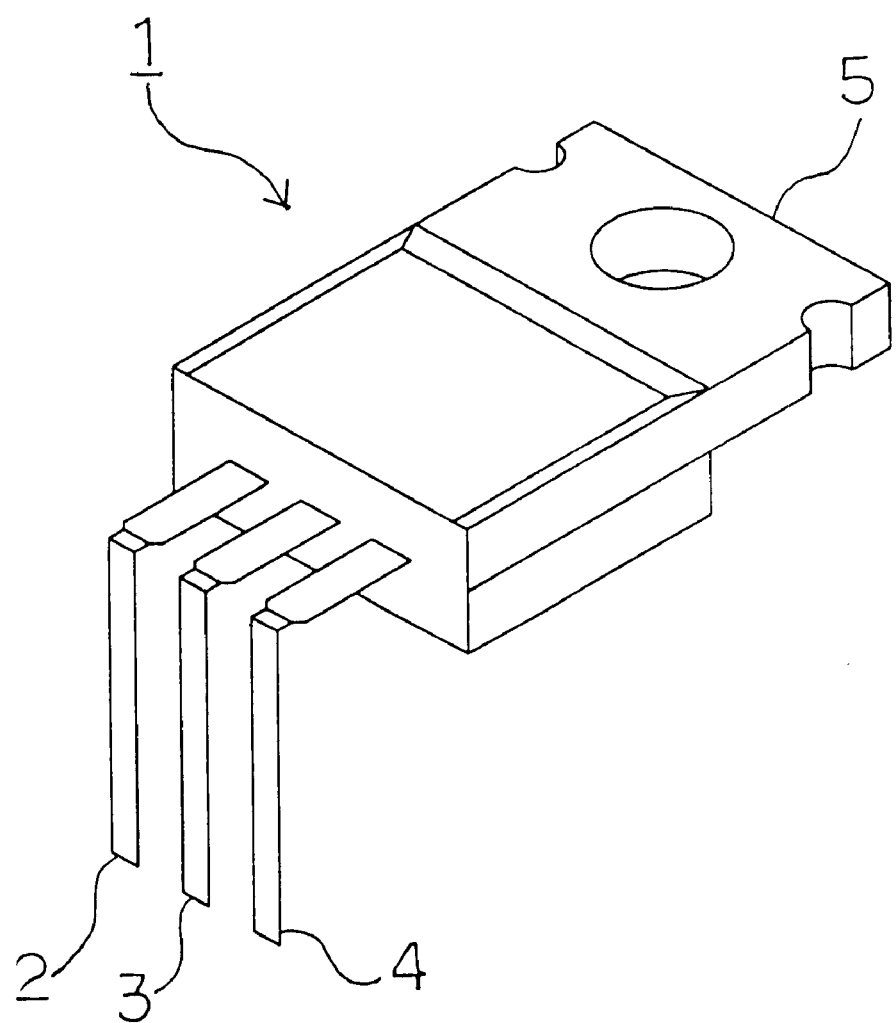
FIG. 11 is an external perspective view showing the power semiconductor device according to the embodiment of the invention.
Figure 12:
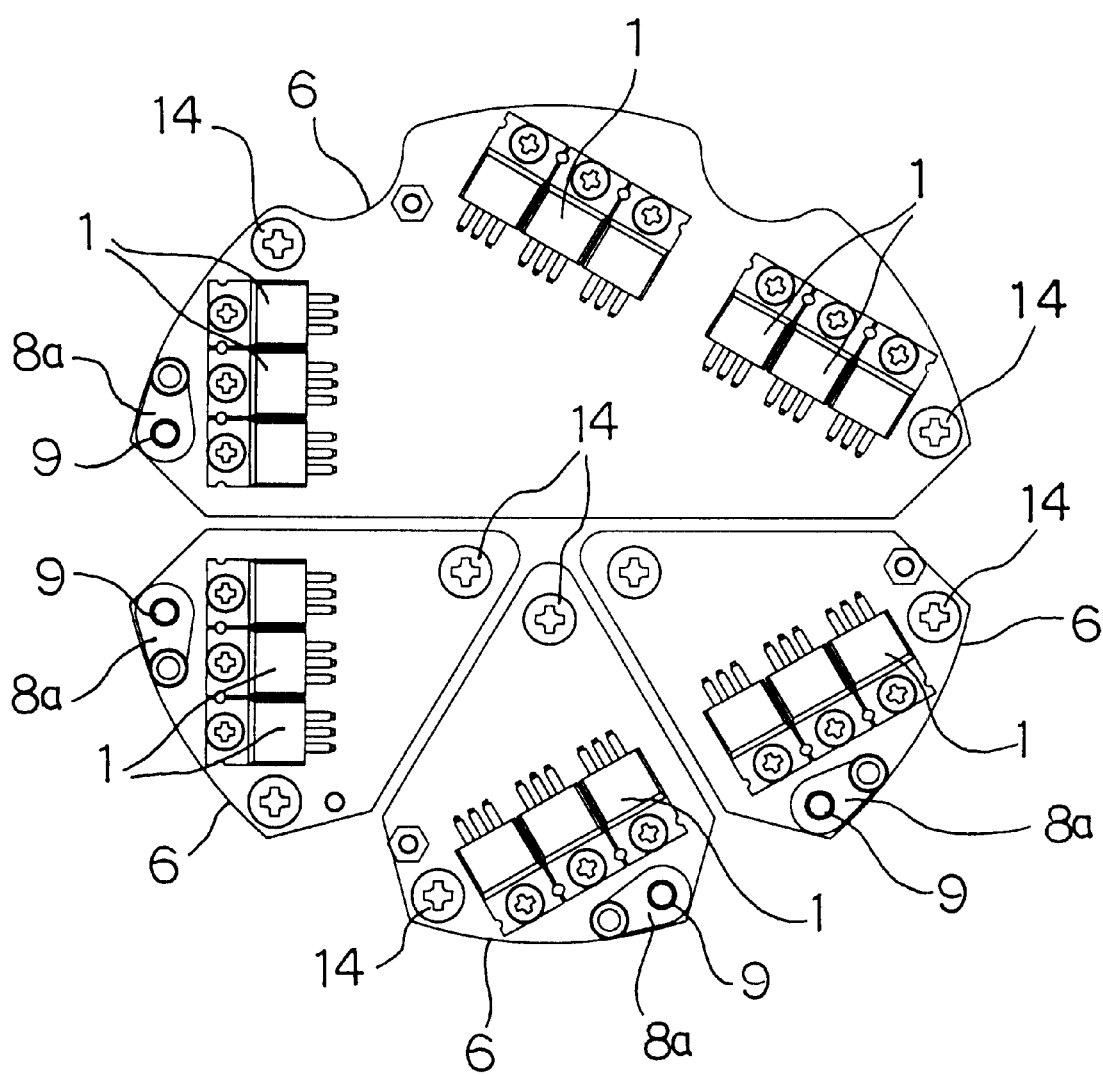
FIG. 12 is a plan view showing the power semiconductor devices and the sub-heat sinks according to the embodiment of the invention.
Figure 13:
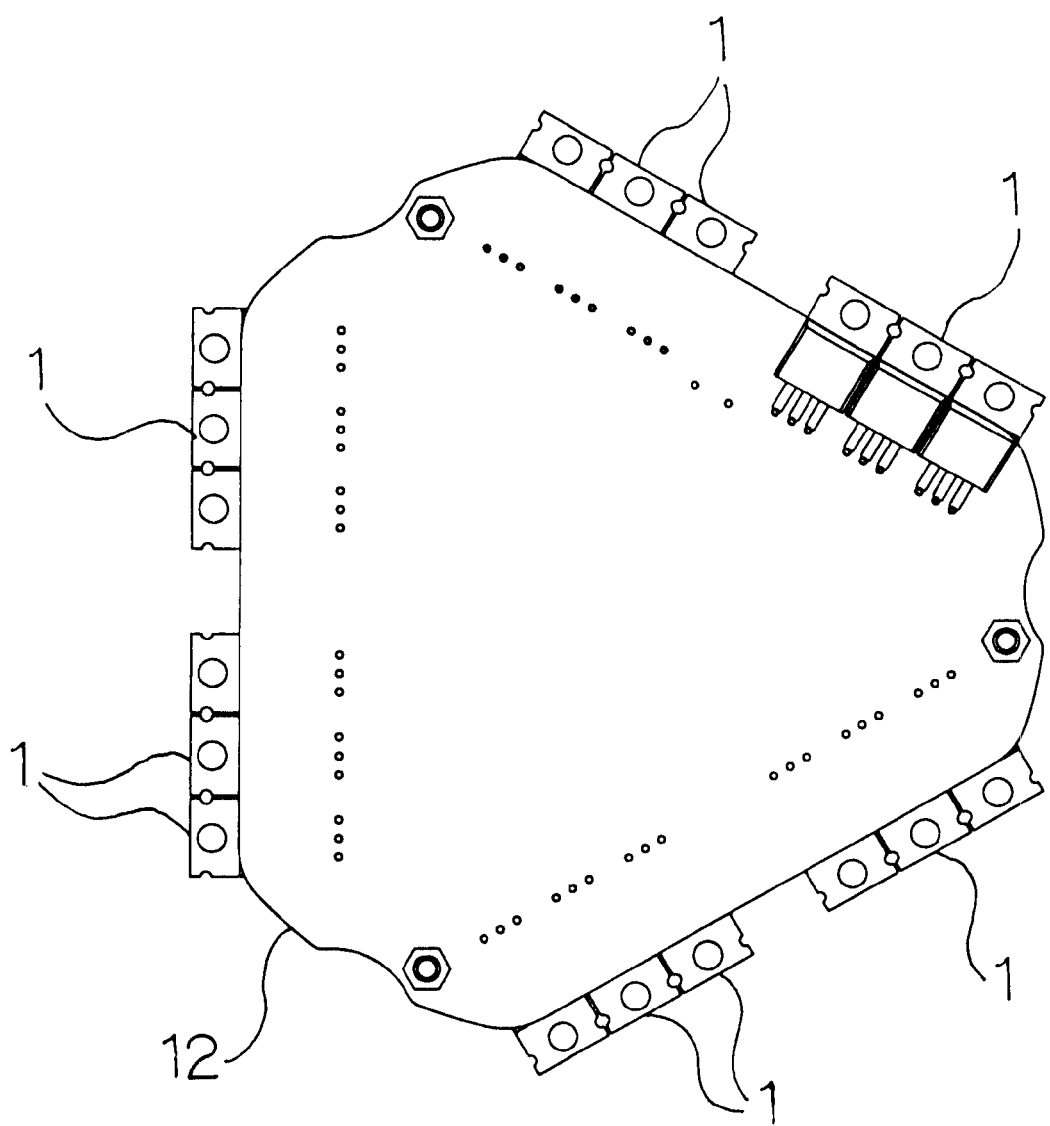
FIG. 13 is a plan view showing the power semiconductor devices and the circuit board according to the embodiment of the invention.

The sub-heat sinks 6 having the same electrical potential in terms of the circuit may be arranged on one side as shown in FIG. 8, and the heat radiating plate 7 may also be formed in a semicircle form accordingly. The arrangement of the sub-heat sinks 6 is not limited to the aforesaid embodiment but may be arranged in various ways, such as in the form of a square.

It has been described in the above embodiment that the power semiconductor device is incorporated in the electric motor. The invention is not limited to the described embodiment but can also be applied generally to other cases using the electric supply and heat radiating apparatus for the power semiconductor device. FET has been described as an example of the power semiconductor device but not in a sense of limiting thereto. For example, there are also transistors, diodes, thyristors, IGBT, SIT and the like, and they can also be combined into a single package for application.

Another embodiment of the invention will be described with reference to FIG. 9 to FIG. 13.

As shown in these drawings, the electric supply and heat radiating apparatus of this embodiment have the sub-heat sinks 6 electrically insulated and fixed to the heat sink case 11.

Other basic structures are the same as in the aforesaid embodiment; like reference numerals are used for like members, and their descriptions will be omitted.

Specifically, the sub-heat sinks 6 of this embodiment are made of a plate member which has on its one side the power semiconductor devices 1 fixed thereto with screws, and fixed to the heat sink case 11 by screwing with an insulation sheet 13 interposed between its other side and the heat sink case 11. The respective electrodes 2, 3, 4 of the power semiconductor device 1 have an L shape.

The sub-heat sinks 6 and the heat sink case 11 have a fixing area larger than that between the sub-heat sinks 6 and the heat radiation metallic parts 5.

To secure the sub-heat sinks 6 to the heat sink case 11 by screws, screws 14 provided with an insulator or screws made of an insulator are used, so as to assure the insulation between them.

In this embodiment, the heat radiation metallic parts 5 are secured to the sub-heat sinks 6 by screws and the sub-heat sinks 6 are secured to the heat sink case 11 by screws, both in a direction of the thickness of the sub-heat sinks 6. Therefore, to secure them by screws, a tool can be inserted from the same direction, so that the production process of the device can be simplified.

With the electric supply and heat radiating apparatus of the power semiconductor device of this embodiment, heat of the sub-heat sinks 6 is radiated by the heat sink case 11, and heat radiation of the power semiconductor device 1 can be improved further more.

Even though the electrical insulation between the sub-heat sinks 6 and the heat sink case 11 increases the heat resistance between them, this embodiment has the fixing areas between the sub-heat sinks 6 and the heat sink case 11 determined to be larger than those between the sub-heat sinks 6 and the heat radiation metallic parts 5. Therefore, an amount of heat conduction from the heat radiation metallic parts 5 to the sub-heat sinks 6 and an amount of heat conduction from the sub-heat sinks 6 to the heat sink case 11 can be secured in good balance. As a result, heat can be radiated from the power semiconductor devices 1 efficiently.

Besides, the sub-heat sinks 6 are made of a plate member and can be produced by stamping. Therefore, their production cost can be reduced. And they can be provided efficiently by securing them to the heat sink case 11 by screws. The flat form of the sub-heat sinks 6 is determined appropriately by considering their fixing areas to the heat sink case 11.

INDUSTRIAL APPLICABILITY

The present invention is directed to the electric supply and heat radiating apparatus for the power semiconductor device in an electric circuit using a plurality of power semiconductor devices, wherein the electric supply structure of the power semiconductor device is simplified and at the same time having the heat radiation action. For example, it is suitably used as a motor drive circuit.

What is claimed is:

1. An electric supply and heat radiating apparatus, comprising:
   a circuit board;
   a plurality of power semiconductor devices mounted on said circuit board, each device having a drain electrode and a heat radiating metallic part electrically connected to said drain electrode within a package of said power semiconductor device; and
   at least one first conductive radiator used as a connection terminal, wherein among said plurality of said power semiconductor devices, only said power semiconductor devices which include said drain electrodes having the same potential are electrically connected and secured to said first conductive radiator through said heat radiating metallic parts thereof.

2. The electric supply and heat radiating apparatus according to claim 1, which further comprises a conductive heat radiating plate to which said at least one first conductive radiator is electrically connected and fixed, said conductive heat radiating plate used as a connection terminal.

3. The electric supply and heat radiating apparatus according to claim 1, wherein said first conductive radiator is electrically insured and fixed to a second conductive radiator.

4. The electric supply and heat radiating apparatus according to claim 3, an area at which said first and second conductive radiators are fixed is greater than an area at which said first conductive radiator and said heat radiating metallic parts are fixed.

5. An electric supply and heat radiating apparatus, comprising:
   a circuit board;
   a plurality of power semiconductor devices mounted on said circuit board, each device having a drain electrode and a heat radiating metallic part electrically connected to said drain electrode within a package of said power semiconductor device;
   at least one first conductive radiator used as a connection terminal, wherein among said plurality of said power semiconductor devices, only said power semiconductor devices which include said drain electrodes having the same potential are electrically connected and secured to said first conductive radiator through said heat radiating metallic parts thereof; and
   a conductive heat radiating plate to which said at least one first conductive radiator is electrically connected and fixed, said conductive heat radiating plate used as a connection terminal and electrically insured and fixed to a second conductive radiator.

* * * * *

UNITED STATES PATENT AND TRADEMARK OFFICE
CERTIFICATE OF CORRECTION

PATENT NO. : 6,704,201 B2
DATED : March 9, 2004
INVENTOR(S) : Nobuyuki Kasuga

It is certified that error appears in the above-identified patent and that said Letters Patent is hereby corrected as shown below:

Column 7,
Line 24, change "insured" to -- insulated --

Column 8,
Line 24, change "insured" to -- insulated --

Signed and Sealed this

Twenty-sixth Day of April, 2005

JON W. DUDAS
*Director of the United States Patent and Trademark Office*